US012750981B1

(12) United States Patent
Lazarowich

(10) Patent No.: US 12,750,981 B1
(45) Date of Patent: Sep. 29, 2026

(54) TURBULENT AIRFLOW FOR COOLING COMPUTING DEVICES

(71) Applicant: Core Scientific, Inc., Bellevue, WA (US)

(72) Inventor: Kamil Lazarowich, San Jose, CA (US)

(73) Assignee: CORE SCIENTIFIC, INC., Austin, TX (US)

(*) Notice: Subject to any disclaimer, the term of this patent is extended or adjusted under 35 U.S.C. 154(b) by 1174 days.

(21) Appl. No.: 17/691,562

(22) Filed: Mar. 10, 2022

Related U.S. Application Data

(63) Continuation-in-part of application No. 17/102,604, filed on Nov. 24, 2020, now Pat. No. 11,856,736.

(60) Provisional application No. 63/161,183, filed on Mar. 15, 2021, provisional application No. 62/983,890, filed on Mar. 2, 2020.

(51) Int. Cl.
*H05K 7/20* (2006.01)

(52) U.S. Cl.
CPC ..... *H05K 7/20745* (2013.01); *H05K 7/20145* (2013.01)

(58) Field of Classification Search
CPC ....................... H05K 7/20745; H05K 7/20145
See application file for complete search history.

(56) References Cited

U.S. PATENT DOCUMENTS

| | | | | |
|---|---|---|---|---|
| 598,216 A * | 2/1898 | Davidson | B64C 11/065 416/207 |
| 6,254,476 B1 * | 7/2001 | Choi | F04D 29/384 416/223 R |
| 8,917,502 B1 * | 12/2014 | Gardner | H05K 7/1497 361/679.5 |
| 9,690,337 B1 * | 6/2017 | Eichelberg | H05K 7/20745 |
| 10,165,710 B1 * | 12/2018 | Pompei | H05K 7/20745 |
| 2006/0269406 A1 * | 11/2006 | Cho | F04D 25/08 415/220 |
| 2007/0064383 A1 * | 3/2007 | Tanaka | G11B 15/6835 361/679.33 |

(Continued)

FOREIGN PATENT DOCUMENTS

| | | | |
|---|---|---|---|
| CN | 107482879 B * | 9/2019 | H05K 7/20918 |
| JP | 4132826 B2 * | 8/2008 | F04D 29/384 |

(Continued)

OTHER PUBLICATIONS

Sato Seiji; Suguru Nakagawa, "Propeller Fan", Apr. 2, 2014, Samsung Electronics Co Ltd, Entire Document (Translation of KR 20140039976). (Year: 2014).*

(Continued)

*Primary Examiner* — Stephen S Sul
(74) *Attorney, Agent, or Firm* — Fishman Stewart PLLC

(57) ABSTRACT

An improved system for cooling computing devices such as in a data center is disclosed. In one embodiment, the system may comprise racks formed by a plurality of stackable sleds each holding multiple computing devices that exhaust hot waste air into a tubular air barrier with one open end and one sealed end. A turbulator may be connected to the open end of the tubular air barrier to create more turbulent airflow. The turbulator may comprise a number of semi-ellipse members connected in a radial pattern forming an ellipsoid. The semi-ellipse members may have notches along a central axis of the ellipsoid and may be twisted along the central axis of the ellipsoid.

18 Claims, 8 Drawing Sheets

(56) References Cited

U.S. PATENT DOCUMENTS

| | | | | |
|---|---|---|---|---|
| 2013/0028718 A1* | 1/2013 | Strom | F01D 9/065 | |
| | | | 415/182.1 | |
| 2013/0084172 A1* | 4/2013 | Kasibhotla | F02C 7/12 | |
| | | | 415/182.1 | |
| 2013/0120931 A1* | 5/2013 | Sankar | G06F 1/181 | |
| | | | 361/679.48 | |
| 2013/0170949 A1* | 7/2013 | Samuels | F03D 3/061 | |
| | | | 415/121.3 | |
| 2015/0189786 A1* | 7/2015 | Rubenstein | H05K 7/1489 | |
| | | | 361/679.02 | |
| 2015/0198143 A1* | 7/2015 | Sandor | F03D 3/062 | |
| | | | 416/197 A | |
| 2017/0079164 A1* | 3/2017 | Crawford | H04L 41/0803 | |
| 2018/0116069 A1* | 4/2018 | McGraw | H05K 7/20709 | |
| 2019/0116684 A1* | 4/2019 | Gold | H05K 7/1489 | |
| 2019/0174651 A1* | 6/2019 | Crawford | H05K 7/1497 | |
| 2019/0364698 A1* | 11/2019 | Johnson | E04H 5/02 | |
| 2019/0373779 A1* | 12/2019 | Roy | H05K 13/00 | |
| 2021/0204452 A1* | 7/2021 | Kazi | G05B 13/024 | |

FOREIGN PATENT DOCUMENTS

| | | | | |
|---|---|---|---|---|
| JP | 5252070 B2 * | 7/2013 | F04D 29/384 | |
| JP | 2014105600 A * | 6/2014 | | |
| KR | 20140039976 A * | 4/2014 | F24F 1/0018 | |
| WO | WO-2020192060 A1 * | 10/2020 | F24F 13/08 | |

OTHER PUBLICATIONS

Nakagawa Masaru, "Propeller Fan and Air Conditioner With Propeller Fan", Jun. 9, 2014, Samsung R & D Inst Japan Co Ltd, Entire Document (Translation of JP 2014105600). (Year: 2014).*

Zhong Jun, "Heat dissipation method of switch power supply module", Dec. 15, 2017, Chongqing Luge Technology Co., Ltd, Entire Document (Translation of CN 107482879). (Year: 2017).*

Du, Shunkai; Zeng, Wei; Tan, Zhouheng; Chen, Liangrui; Fang, Jian; Zeng, Xiaolang; Li, Jinbo; Xie, Peng, "WO 2020192060", Oct. 1, 2020, GD Midea Air-Conditioning Equipment Co., Ltd.; Midea Group Co., Ltd., Entire Document (Translation of WO 2020192060). (Year: 2020).*

Otsuka Masao, "Propeller Fan, Forming Die Thereof and Fluid Feeder", Aug. 13, 2008, Sharp Corp, Entire Document (Translation of JP4132826). (Year: 2008).*

Kojima Azumi; Yokoyama Yuta, "Axial Flow Fan", Jul. 31, 2013, Daikin Ind Ltd, Entire Document (Translation of JP5252070). (Year: 2013).*

* cited by examiner

TURBULENT AIRFLOW FOR COOLING COMPUTING DEVICES

CROSS-REFERENCE TO RELATED APPLICATIONS

This application is a continuation-in-part of and claims the benefit of, and priority to, U.S. application Ser. No. 17/102,604, titled COMPUTING DEVICE SYSTEM AND METHOD, filed Nov. 24, 2020, which claims the benefit of and priority to U.S. Provisional Patent Application Ser. No. 62/983,890, titled COMPUTING DEVICE SYSTEM AND METHOD, filed Mar. 2, 2020.

This application claims the benefit of, and priority to, U.S. Provisional Patent Application Ser. No. 63/161,183, filed on Mar. 15, 2021.

The disclosures of all of the above are hereby incorporated herein by reference in their entireties and for all purposes.

TECHNICAL FIELD

The present disclosure generally relates to the field of computing and, more particularly, to systems and methods for cooling large numbers of computing devices such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing units (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute-intensive workloads (e.g., rendering, artificial intelligence, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional data centers store computing devices in long rows of racks forming rectangular pods, with alternating hot and cold aisles. The computing devices draw in air from the cold aisles and exhaust hot air into the hot aisles, which are then vented out of the data center. While this works well for traditional low power workloads such as web hosting, this often does not provide sufficient cooling for miners and CPU and GPU intensive workloads. This can result in hotspots and overheating. The most common method for improving cooling of computing devices in data centers is mixing in refrigerated air to reduce the temperature of the air that is forced across the computing device by its built-in cooling fans. Unfortunately, a significant drawback to this approach is that refrigeration uses significant amounts of energy on top of the energy already used by the computing devices themselves.

For at least these reasons, there is a desire for a more efficient solution to allow for improved efficient cooling and thermal management of groups of computing devices such as in a data center.

SUMMARY

By positioning the computing devices to exhaust into a tubular air barrier with a turbulator, instead of a traditional rectangular hot aisle, cooling may be improved and hotspots may be reduced or eliminated. A tubular air barrier may reduce hot spots such as those formed in corners of traditional rectangular hot aisles, and use of a turbulator (i.e., a device that turns a laminar airflow into a more turbulent airflow) may further improve the airflow.

An improved system for cooling a plurality of computing devices (e.g., large numbers of computing devices such as in a data center) is contemplated. In one embodiment, the system may comprise a plurality of sleds holding two or more computing devices in a common orientation so that the multiple computing devices in each sled are exhausting hot air in the same direction. The sleds may be interlocking to permit secure stacking. A vertically oriented tubular air barrier with a plurality of exhaust intakes may be connected to or positioned adjacent to the stacks of the sleds, with the computing devices positioned to exhaust air into the tubular air barrier through one or more exhaust intakes. A turbulator may be connected to one end of the tubular air barrier to improve airflow. In some embodiments, the turbulator may comprise a plurality of semi-ellipse members connected in a radial pattern forming an ellipsoid. The semi-ellipse members may have notches (e.g., a trapezoidal notch) along a central axis of the ellipsoid, and the members may be twisted (e.g., also along the central axis of the ellipsoid).

The tubular air barrier may for example be a cylinder or a regular polygonal prism, e.g., having at least 7 sides such as a prism with a pentagonal cross-section (i.e., having 5 long sides and 2 short end sides), a hexagonal cross-section (i.e., having 6 long sides and 2 short end sides), an octagonal cross-section (i.e., having 8 long sides and 2 short end sides), etc. In some embodiments, the sleds may be interlocking and stackable, and may comprise one or more cooling fans. The computing devices themselves may each have one or more cooling fans. The sleds may have exhaust openings, and the computing devices may exhaust waste heat through those exhaust openings and into the tubular air barrier's exhaust intakes.

A turbulator for cooling a plurality of computing devices is also contemplated. The turbulator may be attached to existing hot aisle exhaust vents (e.g., in existing data centers) to create a more rotational turbulent airflow from higher pressure air leaving the exhaust vent. In some embodiments, the turbulator may comprise a plurality of twisted planar semi-ellipse members connected in a radial pattern forming an ellipsoid configured to be mounted above a vertically-oriented tubular air barrier such as a data center exhaust vent.

A data center for housing a plurality of computing devices is also contemplated. In one embodiment, the data center may comprise a plurality of pods, with each pod having a number of racks that hold multiple computing devices. The racks may be positioned radially around a vertical tubular air barrier having a plurality of exhaust intakes, and the computing devices may be positioned to exhaust hot air into those exhaust intakes. A turbulator may be positioned within one end of the vertical tubular air barrier, with the vertical tubular air barrier sealed to a floor of the data center at one end and extending through a ceiling of the data center at the other end with the turbulator. In some embodiments the racks may be formed by stackable sleds, each holding a number of the computing devices.

In some embodiments, the vertical tubular air barrier may be formed from panels attached to the racks (or attached to sleds forming the racks) when the racks are attached and sealed together to form an annular cylindrical rack around the outside of the vertical tubular air barrier formed by the panels.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
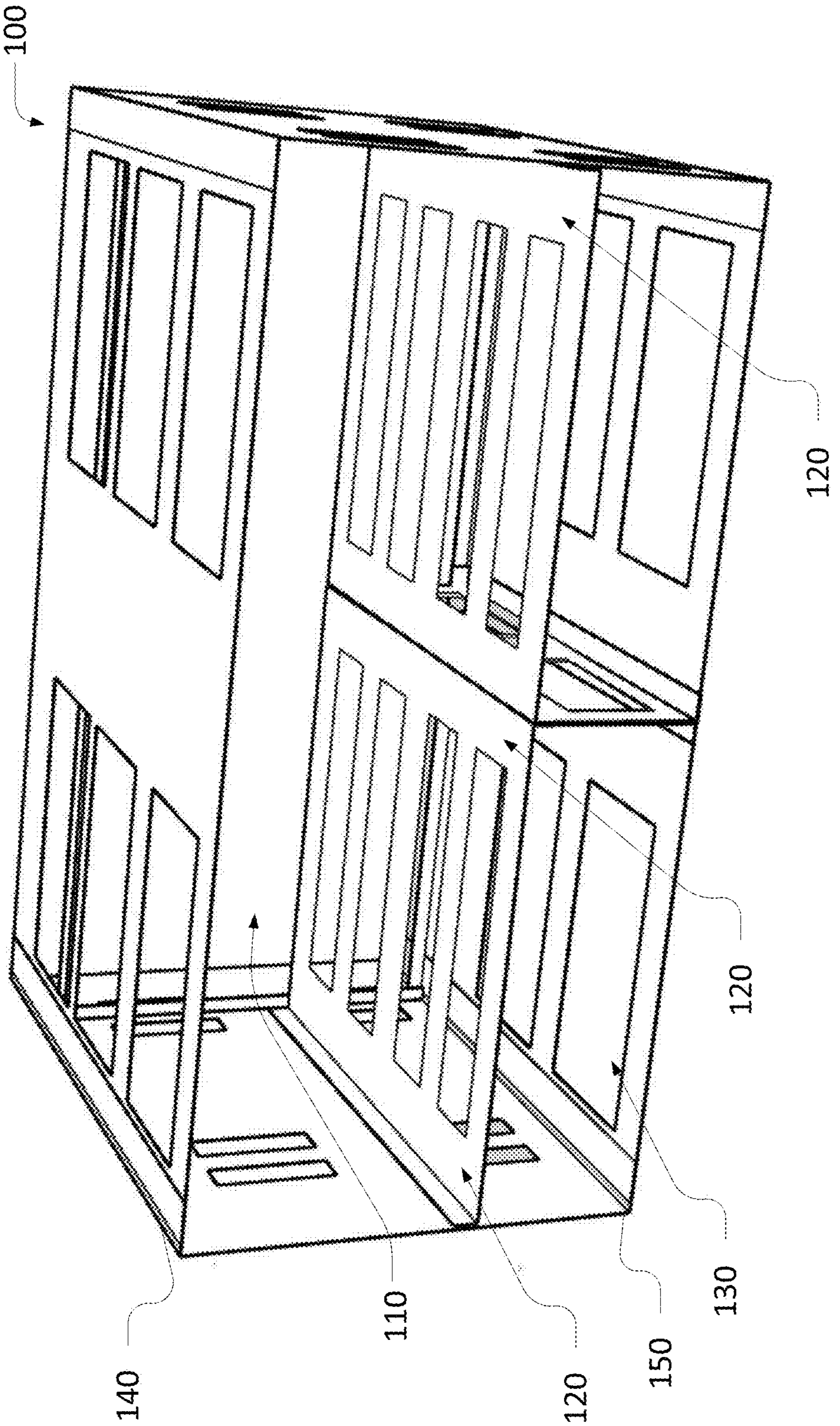
FIG. 1 is a perspective view of one example embodiment of a sled for computing devices according to the teachings of the present disclosure.

Referring now to FIG. 1, a perspective view of one example embodiment of a sled for holding computing devices according to the teachings of the present disclosure is shown. In this embodiment, sled 100 comprises a number of positions 120 for holding computing devices. The computing devices may each be held in position so that they are exhausting hot air out of an exhaust opening 110 in the sled. Sled 100 may for example be made sheet metal, plastic or other material. Sled 100 may have one or more openings 130 permitting lifting (e.g., with a forklift) of the sled, even when fulling loaded. Sled 100 may be interlockable and stackable. For example, a ridge or lip 140 may extend from the top of sled 100 and engage with a corresponding groove 150 on the bottom of sled 100. Tabs and slots or other mechanisms (e.g., simple holes with bolts, latches, sliding pins, or shipping container twist-lock devices) may be used to enable secure stacking of multiple empty or loaded sleds 100.

Figure 2:
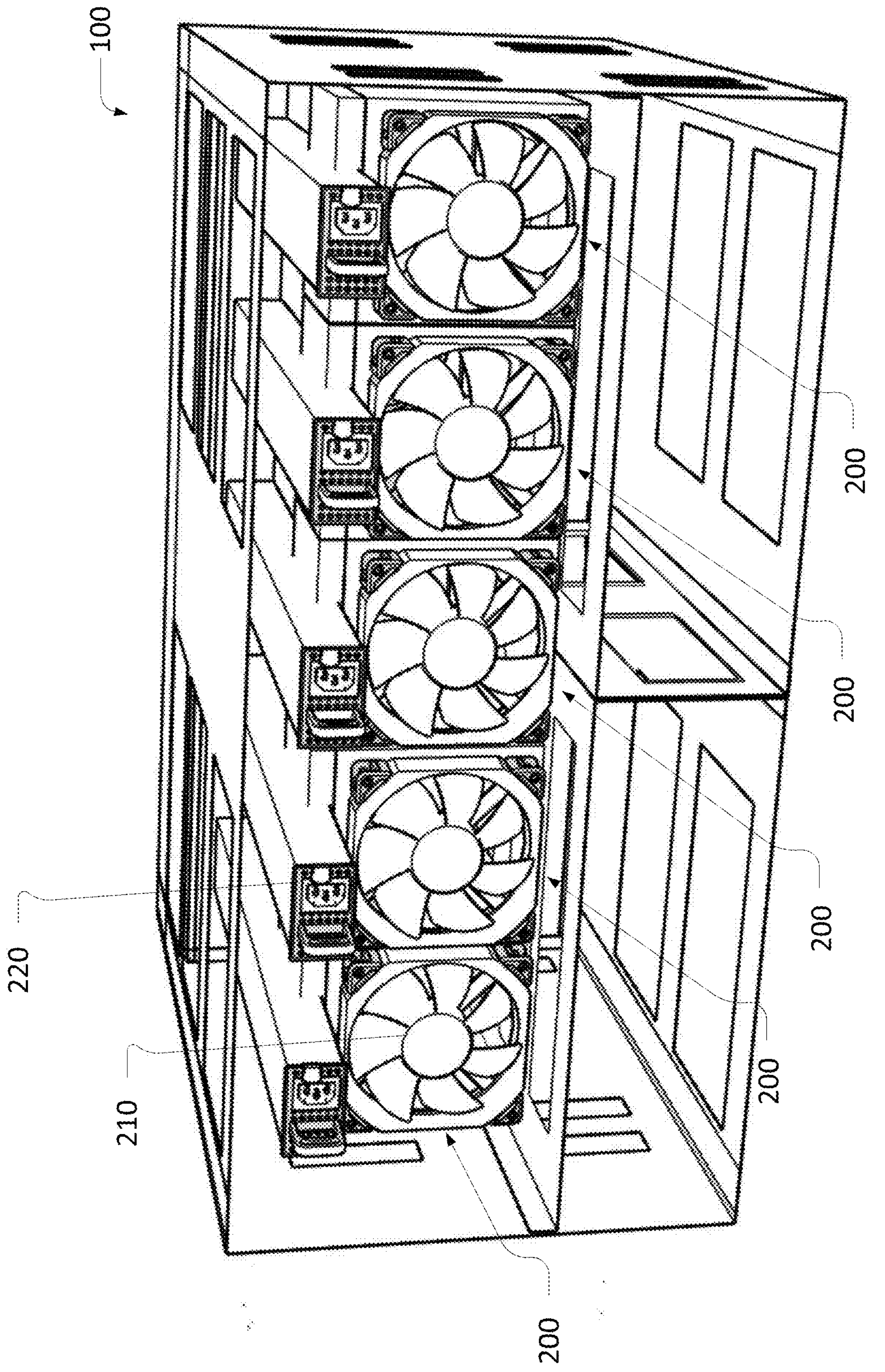
FIG. 2 is a perspective view of one example embodiment of a sled holding computing devices according to the teachings of the present disclosure.

Referring now to FIG. 2, a perspective view of one example embodiment of a sled holding computing devices according to the teachings of the present disclosure is shown. In this embodiment, sled 100 is configured to hold 5 computing devices 200, each having one or more fans 210 and power supply 220. Fans 210 may pull in cool air from one side of sled 100, force it through the case of the computing device 200, and then force it out an exhaust opening at the other side of sled 100. In some embodiments, the sled may have a common power supply to support the computing devices it holds.

Figure 3:
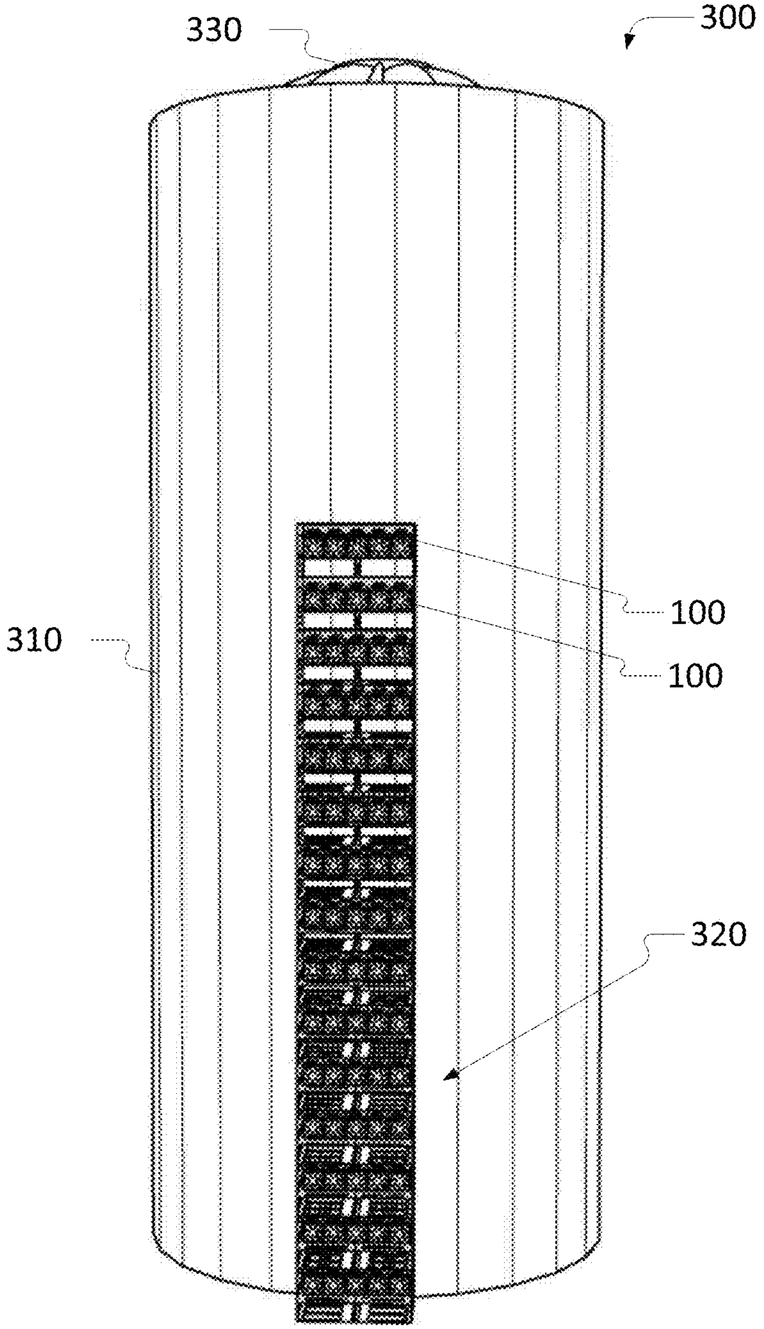
FIG. 3 is a perspective view of one example embodiment of an improved system for cooling computing devices according to the teachings of the present disclosure.

Referring now to FIG. 3, a perspective view of one example embodiment of an improved system 300 for cooling computing devices according to the teachings of the present disclosure is shown. In this embodiment, a number of sleds 100 are stacked to form a rack 320. Rack 320 is positioned against a tubular air barrier 310 into which the computing devices on sleds 100 exhaust their heated waste air. While only one rack 320 is shown, multiple racks may be positioned around the circumference of tubular air barrier 310. Once the heated exhaust air enters tubular air barrier 310, the barrier prevents it from being recirculated back into the computing devices on rack 320. Instead, the heated waste air is trapped in tubular air barrier 310 and is exhausted through the top of the tubular air barrier through turbulator 330, which in this embodiment is positioned at the top end of tubular air barrier 310. To make efficient use of space, in some embodiments, tubular air barrier 310 maybe as tall as a ceiling or roof of a commercial or industrial building or warehouse. Similarly, in some embodiments, rack 320 may have sleds stacked as high as a forklift or commercial scissor lift may be able to conveniently reach.

With many computing devices exhausting air into the tubular air barrier at the same time, air pressure within the tubular air barrier may rise significantly over the ambient air pressure outside the air barrier, so tubular air barrier may be built to withstand this pressure differential. For example, the tubular air barrier may be made of sheet metal, wood, or fiberglass and in some embodiments may be reinforced (e.g., with cross members providing support).

Figure 4:
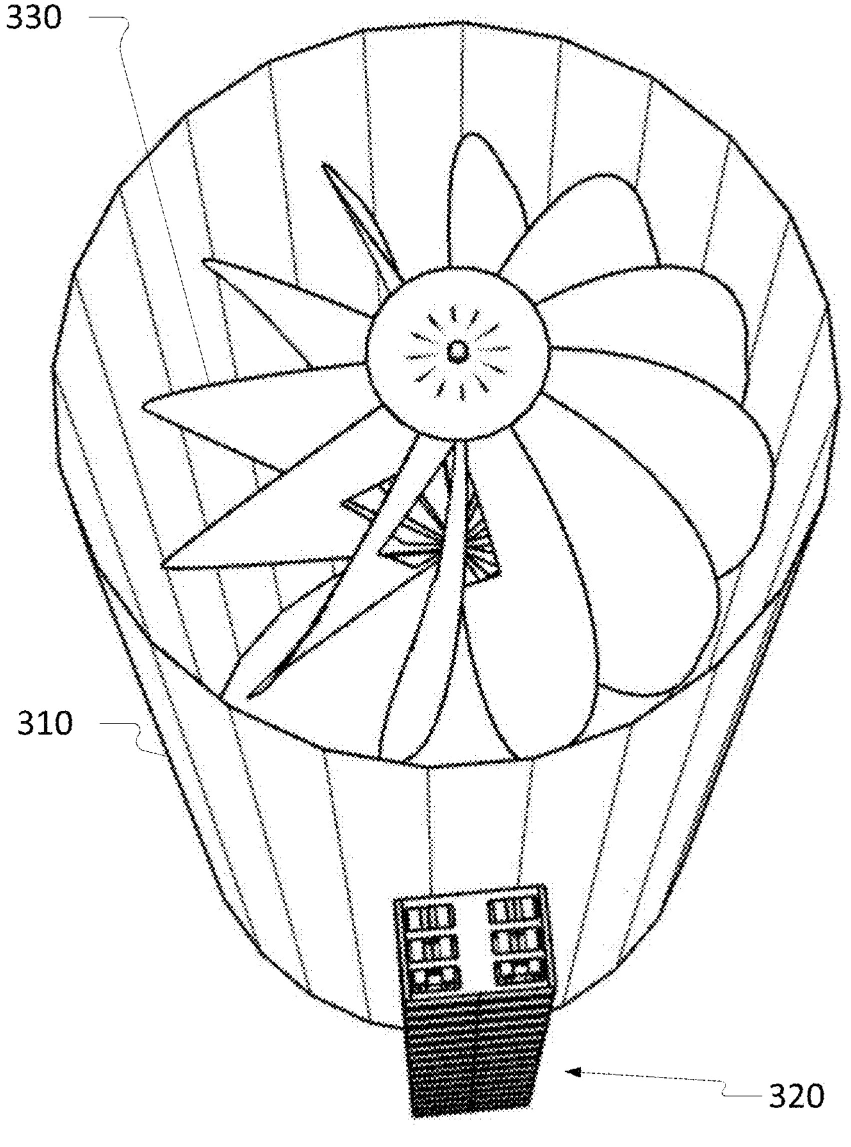
FIG. 4 is a top-down perspective view of one example embodiment of a rack and tubular air barrier according to the teachings of the present disclosure.

Referring now to FIG. 4, a top-down perspective view of one example embodiment of a rack and tubular air barrier according to the teachings of the present disclosure is shown. In this view, turbulator 330 is shown positioned at the top of tubular air barrier 310. Turbulator 330 maybe mounted to the top of tubular air barrier 310 for example by one or more steel beams or crossmembers that attach to the center of turbulator 330. In some embodiments, the turbulator 330 may be mounted in a fixed position. In other embodiments, the turbulator 330 may be mounted to a crossmember with bearings to permit rotation.

Figure 5:
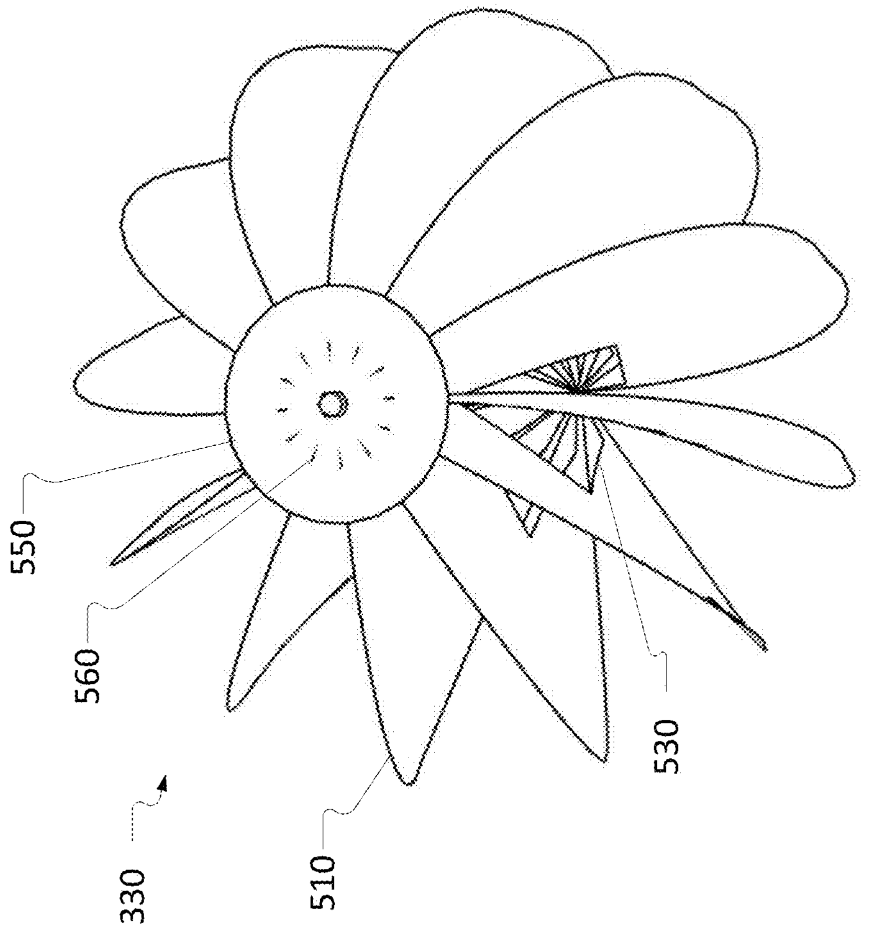
FIG. 5 is a perspective view of one example embodiment of a turbulator according to the teachings of the present disclosure.

Referring now to FIG. 5, a perspective view of one example embodiment of a turbulator according to the teachings of the present disclosure is shown. In this embodiment, turbulator 330 comprises a number of semi-ellipse members 510 that are arranged radially around the center axis of turbulator 330. Semi-ellipse members 510 may be twisted along the center axis of turbulator 330 and may have one or more notches 530 (e.g., trapezoidal) removed along the center axis of the turbulator 330.

Those skilled in the art will appreciate that semi-ellipse members 510 may for example be constructed of sheet metal (e.g., stainless steel, aluminum), fiberglass, plastic, wood, or composite materials. In some embodiments, the entire turbulator, or portions thereof, may be 3D printed of plastic or composite materials. In some embodiments, the semi-ellipse members 510 may be held together by a disc 550 having a number of radial slots 560 into which the semi-ellipse members 510 engage.

Figure 6:
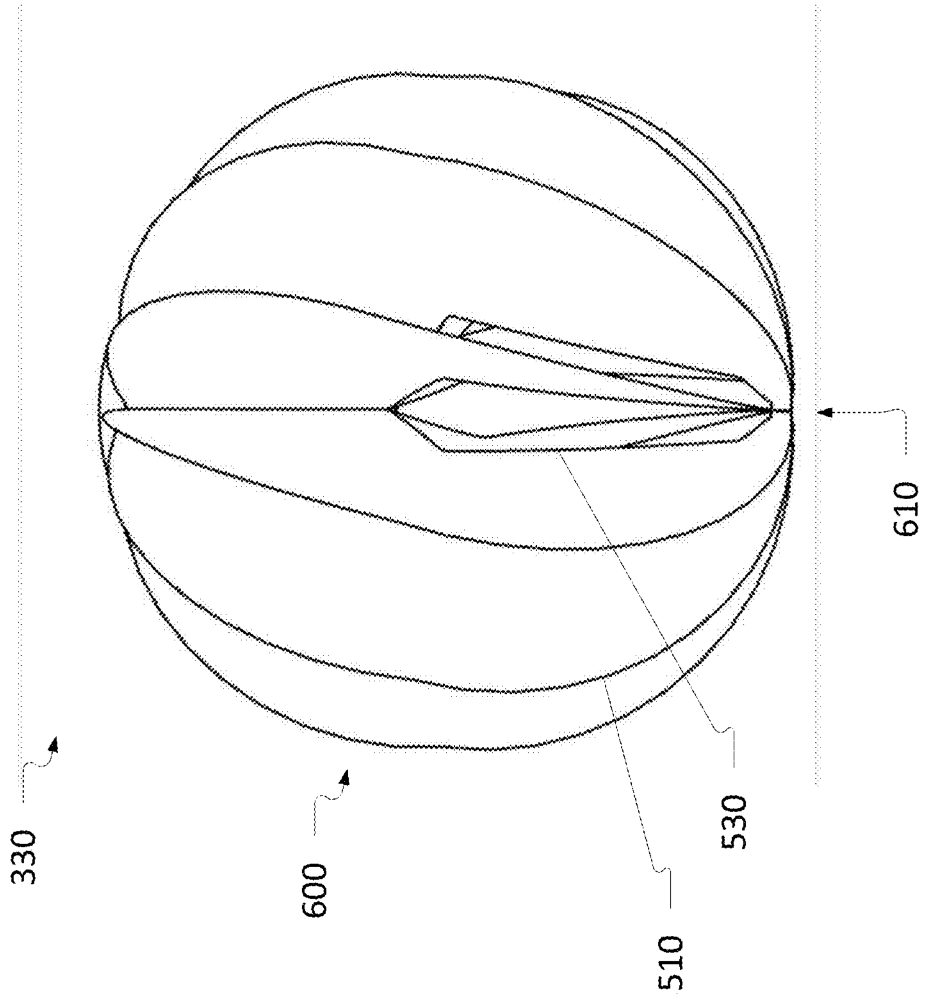
FIG. 6 is a side view of one example embodiment of a turbulator according to the teachings of the present disclosure.

Referring now to FIG. 6, a side view of one example embodiment of a turbulator 330 according to the teachings of the present disclosure is shown. As shown in this figure, in some embodiments the semi-ellipse members 510 may form a spheroid 600 around a central axis 610 of turbulator 330.

Figure 7:
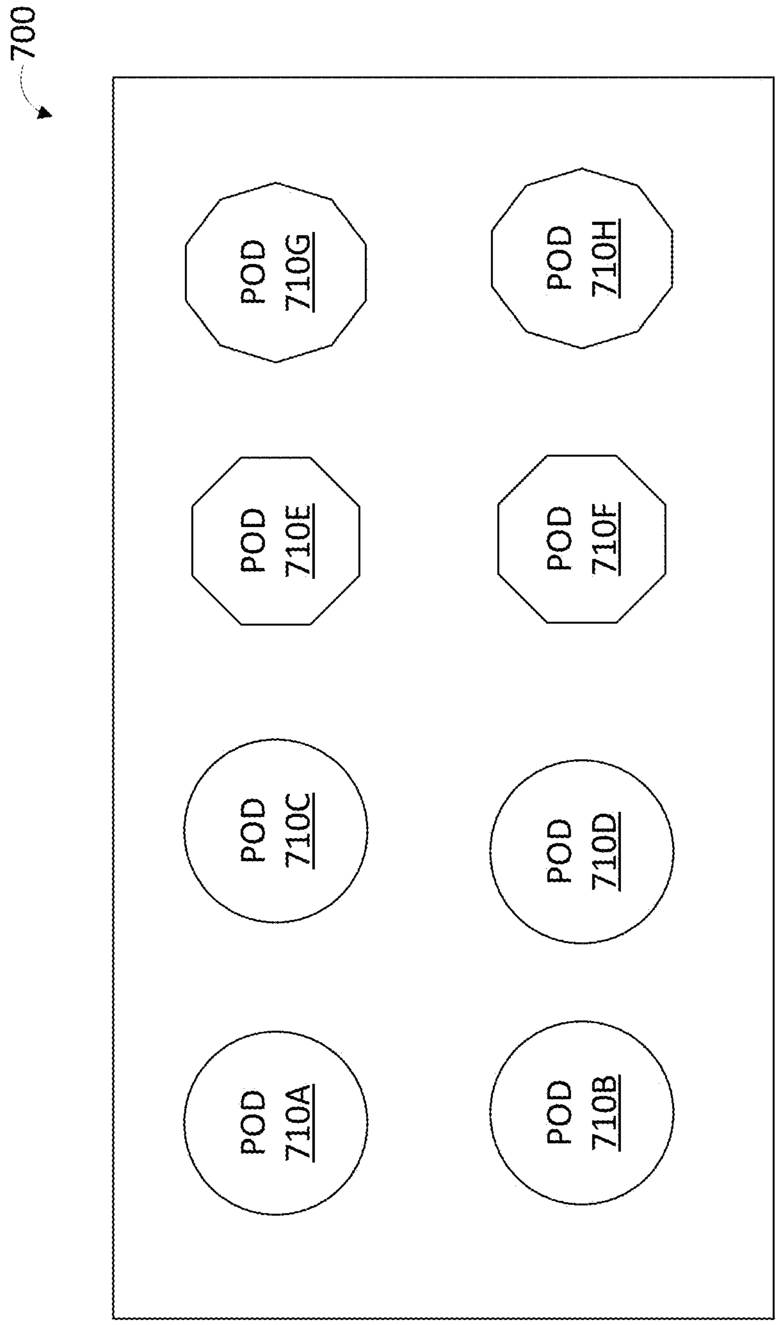
FIG. 7 is a top-down view of one example embodiment of a data center according to the teachings of the present disclosure.

Referring now to FIG. 7, a top-down view of one example embodiment of a data center 700 according to the teachings of the present disclosure is shown. As shown in the figure, the racks and tubular air barriers together form the pods 710A-H, which are tubular in shape. For example, pods 710A-D are cylindrical, pods 710E-H are vertical polygonal (hexagonal) prisms, and pods 710G-H are vertical polygonal (octagonal) prisms.

Figure 8:
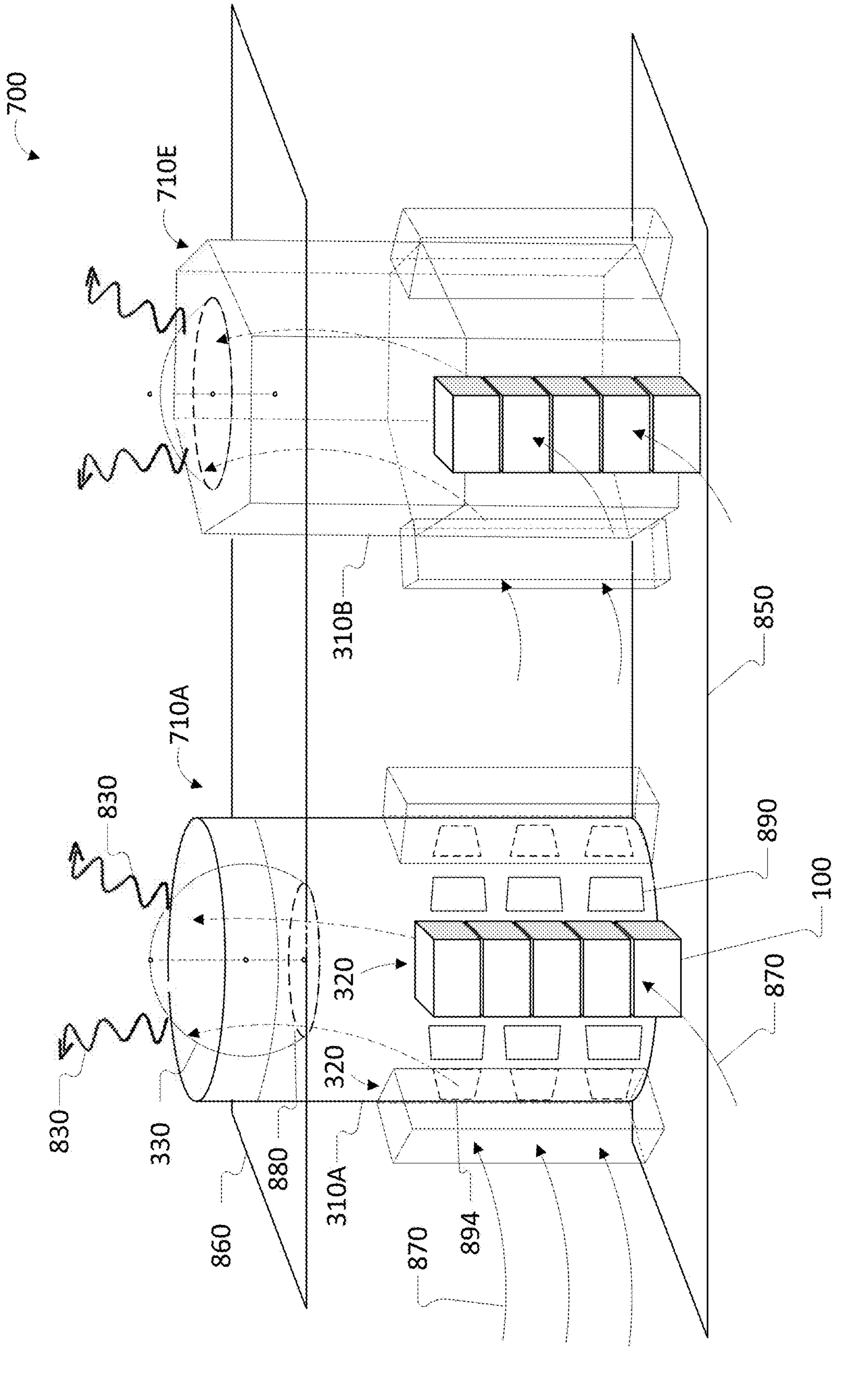
FIG. 8 is a perspective view of a portion of one example embodiment of a data center according to the teachings of the present disclosure.

Referring now to FIG. 8, a perspective view of a portion of one example embodiment of a data center 700 according to the teachings of the present disclosure is shown. In this example embodiment, two pods 710A and 710E within data center 700 are shown. Each pod has a number of racks 320 (formed by stacks of sleds 100 holding computing devices) positioned radially around the circumference of a tubular air barrier (cylindrical air barrier 310A for pod 710A and hexagonal prism air barrier 310B for pod 710E). The computing devices in the sleds in racks 320 are positioned to align with open exhaust intakes 894 and draw in cool air as shown by arrows 870 and expel heated air through open exhaust intakes 894 into the tubular air barriers as shown by arrows 880. Once the hot air is within the tubular air barrier, the pressure and temperature differential force it upward and through turbulator 330, which takes the generally laminar airflow from the computing devices and creates a more turbulent airflow, as shown by arrows 830. The racks may be fixed (e.g., bolted in place) or may be repositionable (e.g., held in place solely by their weight and friction), and the sleds (or the computing devices on the sleds) may be sealed to the exhaust intakes (e.g., with foam or rubber gaskets) to prevent hot air from leaking back to the computing device instead of passing through the exhaust intakes.

The exhaust intakes may be closed (e.g., sealed with a removable panel) as shown by closed exhaust intake 890 when no computing devices are attached. In some embodiments, the tubular air barriers may have a door (not shown) to permit maintenance access inside the barrier to permit opening and closing of the exhaust intakes and provide access to the computing devices. In some embodiments the tops of tubular air barriers may have caps or wire mesh filters (not shown) positioned above the top of the air barrier to prevent rain and snow from entering the air barrier, but in other embodiments the airflow may be high enough to prevent any precipitation, debris, or birds from entering the air barrier, even without a cap or filter.

In some embodiments, the tubular air barriers may be sealed at the bottom to the floor 850 of the data center 700 to prevent hot air from being pulled back in by the computing devices. Similarly, the tubular air barriers may also be sealed at the ceiling 860 of the data center 700. In some embodiments the tubular air barrier extends above the ceiling and roof of the data center. In other embodiments, it may end flush with the roof of the data center. In yet other embodiments the tubular air barriers may be freestanding outside of a structure. The sleds may incorporate particulate filters to prevent dust and debris from being pulled into the computing devices.

Reference throughout the specification to “various embodiments,” “with embodiments,” “in embodiments,” or “an embodiment,” or the like, means that a particular feature, structure, or characteristic described in connection with the embodiment is included in at least one embodiment. Thus, appearances of the phrases “in various embodiments,” “with embodiments,” “in embodiments,” or “an embodiment,” or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A system for cooling a plurality of computing devices, the system comprising:

a plurality of sleds holding two or more computing devices of the plurality of computing devices;

a tubular air barrier with a plurality of exhaust intakes, wherein the plurality of sleds are positioned around the tubular air barrier such that the two or more computing devices expel heated air into the plurality of exhaust intakes; and a turbulator connected to one end of the tubular air barrier, wherein the turbulator comprises a plurality of semi-ellipse members arranged radially around a central axis of the turbulator and connected in a radial pattern forming an ellipsoid or a spheroid, and wherein one or more of the plurality of semi-ellipse members has a notch along the central axis of the turbulator, the notch disposed on a radially inner side of the one or more of the plurality of semi-ellipse members relative to the central axis.

2. The system of claim 1, wherein the tubular air barrier is a cylinder.

3. The system of claim 1, wherein the tubular air barrier is a regular polygonal prism having at least 7 sides.

4. The system of claim 1, wherein the plurality of sleds are interlocking and stackable.

5. The system of claim 1, wherein the plurality of sleds comprise one or more cooling fans.

6. The system of claim 1, wherein each of the plurality of computing devices comprises one or more cooling fans.

7. The system of claim 1, wherein each of the plurality of sleds comprises an exhaust opening, wherein the two or more computing devices expel the heated air through the exhaust opening into the plurality of exhaust intakes.

8. The system of claim 1, wherein each sled of the plurality of sleds has an exhaust opening, wherein each sled of the plurality of sleds is positioned to align its exhaust opening with the plurality of exhaust intakes.

9. The system of claim 1, wherein the turbulator is mounted in a rotationally fixed position.

10. The system of claim 9, further comprising a disc having a plurality of slots, wherein the plurality of semi-ellipse members are attached to the disc through the plurality of slots.

11. The system of claim 10, wherein the plurality of slots are positioned radially on the disc.

12. The system of claim 1, wherein each of the plurality of semi-ellipse members extend axially and is twisted along the central axis of the turbulator.

13. The system of claim 1, wherein the notch is trapezoidal.

14. A data center for housing a plurality of computing devices, the data center comprising:

a plurality of pods, wherein each pod comprises:

a plurality of racks each holding two or more computing devices of the plurality of computing devices;

a vertical tubular air barrier with a plurality of exhaust intakes, wherein the plurality of racks are positioned radially around the vertical tubular air barrier and the two or more computing devices are positioned to exhaust air into the plurality of exhaust intakes;

a turbulator positioned within one end of the vertical tubular air barrier, wherein the vertical tubular air barrier is sealed to a floor of the data center on a first end of the vertical tubular air barrier and extends through a ceiling of the data center on a second end of the vertical tubular air barrier; and wherein the turbulator comprises a plurality of semi-ellipse members arranged radially around a central axis of the turbulator and connected in a radial pattern forming an ellipsoid or a spheroid, wherein one or more of the plurality of semi-ellipse members has a notch along the central axis of the turbulator, the notch disposed on a radially inner side of the one or more of the plurality of semi-ellipse members relative to the central axis.

15. The data center of claim 14, wherein the racks comprise a plurality of sleds, wherein each of the plurality of sleds comprises a plurality of positions for the two or more computing devices.

16. The data center of claim 14, wherein the turbulator is mounted in a rotationally fixed position.

17. The data center of claim 14, wherein each of the plurality of semi-ellipse members extend axially and is twisted along a central axis of the turbulator.

18. The data center of claim 14, wherein the notch is trapezoidal.

* * * * *